(12) United States Patent
Macks

(10) Patent No.: US 6,259,287 B1
(45) Date of Patent: Jul. 10, 2001

(54) REGULATED VOLTAGE SUPPLY WITH LOW VOLTAGE INHIBIT RESET CIRCUIT

(75) Inventor: Harold Ryan Macks, Redford, MI (US)

(73) Assignee: Visteon Global Technologies, Inc., Dearborn, MI (US)

(*) Notice: Subject to any disclaimer, the term of this patent is extended or adjusted under 35 U.S.C. 154(b) by 0 days.

(21) Appl. No.: 09/620,141

(22) Filed: Jul. 20, 2000

(51) Int. Cl.[7] .................................................. H03L 4/06
(52) U.S. Cl. .......................... 327/143; 327/198; 327/538
(58) Field of Search ................................... 327/143, 198, 327/142, 540, 584, 538, 542

(56) References Cited

U.S. PATENT DOCUMENTS

| | | | |
|---|---|---|---|
| 2,832,035 | 4/1958 | Bruck et al. | 323/22 |
| 2,888,633 | 5/1959 | Carter | 323/9 |
| 3,101,441 | 8/1963 | Curry | 323/22 |
| 3,261,980 | 7/1966 | McCartney, Jr. et al. | 307/86 |
| 3,541,425 | 11/1970 | Weidmann | 323/22 |
| 3,548,294 | 12/1970 | Houghton | 323/4 |
| 3,881,150 | * 4/1975 | Gay | 323/22 |
| 4,052,660 | 10/1977 | Shuey | 323/19 |
| 4,614,880 | * 9/1986 | Go et al. | 327/143 |
| 5,036,269 | 7/1991 | Murari et al. | 323/266 |
| 5,313,112 | * 5/1994 | Macks | 327/143 |
| 5,760,625 | * 6/1998 | Macks | 327/198 |
| 5,821,697 | * 10/1998 | Weber | 315/200 |

* cited by examiner

Primary Examiner—Tuan T. Lam
Assistant Examiner—Hiep Nguyen
(74) Attorney, Agent, or Firm—Mark Mollon

(57) ABSTRACT

A regulated voltage supply contains a zener diode controlled by a constant current generator to maintain the zener voltage at a constant level regardless of the swings of the voltage input to the diode. A current amplifier responds to the constant current generator to maintain the output voltage of the regulated voltage supply at the value of the zener voltage regardless of the demands of the load. A low voltage inhibit circuit responds to the magnitude of the input voltage and the magnitude of the voltage on the zener diode to generate a binary voltage signal for inhibiting the operation of a load such as a microcomputer when the voltage regulator is below the zener voltage level and the input is below the desired voltage.

5 Claims, 1 Drawing Sheet

REGULATED VOLTAGE SUPPLY WITH LOW VOLTAGE INHIBIT RESET CIRCUIT

BACKGROUND OF THE INVENTION

1. Field of the Invention

This invention relates to voltage regulator circuits in general and more particularly to low cost stable voltage regulators controlled by a constant current generator having a voltage regulator device and having a low voltage inhibit circuit.

2. Description of the Related Art

It is well known that microcomputers operating from regulated power supplies must be inhibited during both the power-up phase and also in the event that the DC power to the regulated power supply is interrupted or drops below a predetermined level. U.S. Pat. No. 5,313,112 issued on May 17, 1994 to Macks entitled "Low Voltage Inhibiting Circuit For A Microcomputer" and is incorporated herein by reference, sought to find a low cost solution to achieving the desired functions. This patent required separate voltage regulating circuits. One circuit to provide the regulated supply voltage and another circuit to use as a comparison reference for the power on reset and the low voltage inhibit functions.

In U.S. Pat. No. 5,760,625 issued on Jan. 2, 1998 to Macks entitled "Low Cost Microcomputer Power Supply With Power On Reset And Low Voltage Inhibit Functionality" that is incorporated herein by reference, describes a five volt regulator with a reset circuit. This circuit is not robust to the swings in the power feed potential. In automotive applications the power feed is the vehicle battery which is subject to large variations in potential from 3 to 18 volts.

SUMMARY OF THE INVENTION

Still other times the power supply must be provided with a reset or inhibit function when the regulated supply is dropping below its regulated voltage. This voltage drop out occurs when the power feed in the vehicle drops below about six to eight volts. When the power feed drops below this level, the regulated supply will begin to supply less than its intended voltage. In the case that the regulated supply is providing power to a microcomputer, it is imperative that the reset or inhibit line be activated when the five volt regulator can no longer supply five volts. This function of activating the reset line under low output voltages from the five volt regulator is referred to as the "low voltage inhibit".

It is therefore a principal advantage of the invention to provide low cost voltage regulator responsive to voltage swings of a power supply while maintaining a constant regulated voltage.

It is also a key advantage of the invention to maintain a constant regulated load current to the load during load current swings.

It is yet another advantage of the invention to generate a voltage inhibit signal for controlling an output load such as a microcomputer. The voltage inhibit signal responds to the input signal to the voltage regulator and the voltage generated by the regulating element to generate either one of two binary logic states.

These and other advantages will become apparent from a stable regulated voltage supply and low voltage inhibit supply for maintaining a regulated voltage to a load independently of the voltage input from the power supply. The stable regulated supply has an input for receiving a voltage signal from a power supply such as a battery. The output of the regulated supply is operatively connected to a load such as a microcomputer. A current amplifier voltage regulator is connected in circuit between the input and the output for supplying current to the load upon demand at a regulated voltage.

A zener diode is electrically connected in circuit between the input and a reference potential, such as ground. The zener diode has a zener voltage substantially equal to the desired output of the voltage regulator. A constant current generator is electrically connected in circuit with the zener diode and operates to maintain a specified current through the zener diode for operating the zener diode at its zener voltage. The constant current generator shunts all current in excess of the low-test current from the zener diode. The constant current generator controls the current amplifier voltage regulator to maintain its output at substantially the value of the zener voltage regardless of the current demand of the load.

DETAILED DESCRIPTION OF THE PREFERRED EMBODIMENT

Figure 1:
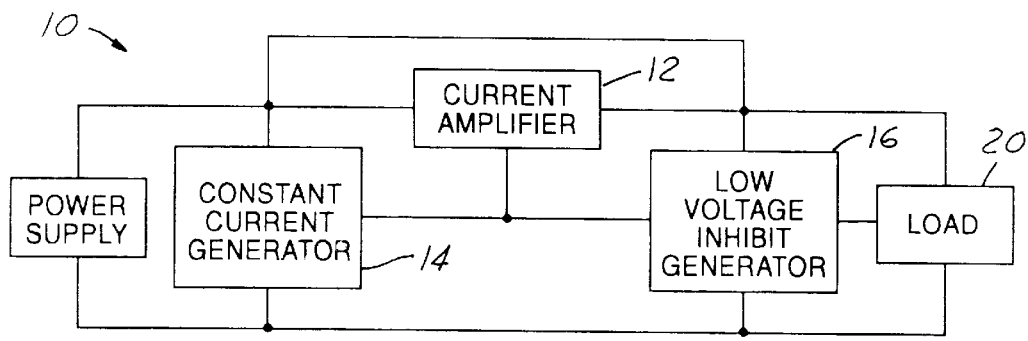
FIG. 1 is a block diagram of the regulated voltage supply.

Referring to the FIGS. by the characters of reference, there is illustrated in FIG. 1 a block diagram of a regulated voltage supply 10 having a current amplifier voltage regulator 12, a constant current generator 14 and a low voltage inhibit circuit 16. The circuit is connected to a power supply 18 such as an automotive vehicle battery. The battery output voltage V1 fluctuates over a wide range of voltages during the operation of the vehicle. The regulated voltage supply 10 provides a stable voltage output to the load or microcomputer MCU 20. In the preferred embodiment, the stable voltage output is five volts (5 v) supplied to the VCC input 22 to the microcomputer 20 and the output of the voltage inhibit circuit is a binary voltage level supplied to the RESET input 24 of the microcomputer 20.

Figure 2:
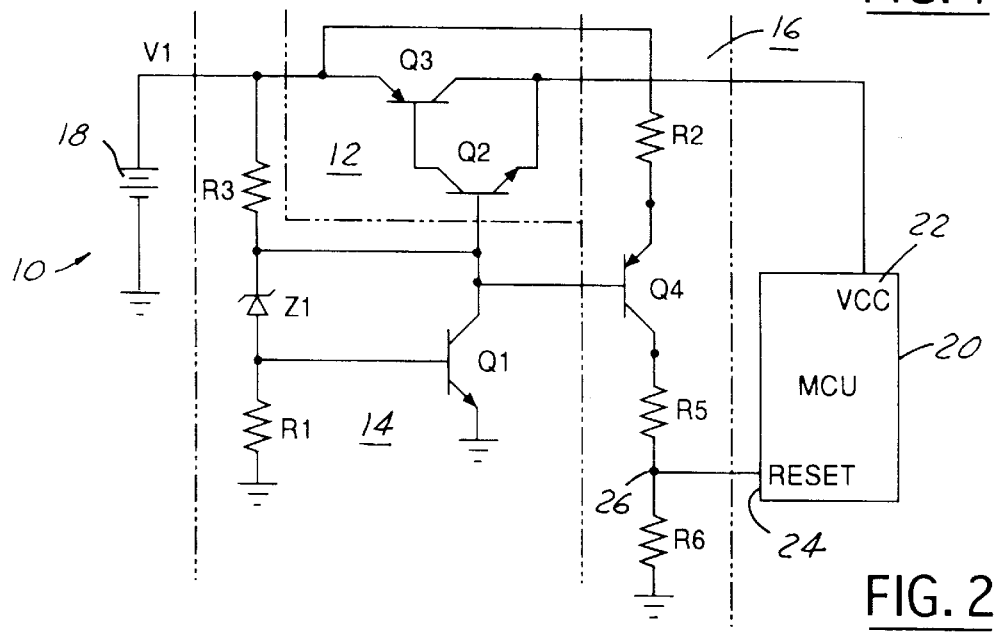
FIG. 2 is a schematic of the voltage regulator circuit.

In FIG. 2, the voltage reference of 5 v in the preferred embodiment is established by a zener diode Z1 that is connected in series with the battery 18 through resistor R3. The improvement to this regulator over the previously identified U.S. Pat. No. 5,760,625 is that the current through zener diode Z1 is regulated to a substantially constant current regardless of the load current. Therefore, the swings in the battery supply voltages V1 from six to eighteen volts does not appreciably effect the current through the zener diode Z1 and the subsequent zener voltage developed across the zener diode.

In order to achieve constant current through the zener diode Z1, its cathode is connected through the resistor R3 to the battery supply voltage V1. The anode of the zener diode Z1 is connected through a resistor R1 to ground. A transistor Q1 is connected in a grounded emitter configuration such that its collector is connected to the cathode of the zener diode Z1 and its base is connected to the anode of the zener diode Z1.

Figure 4:
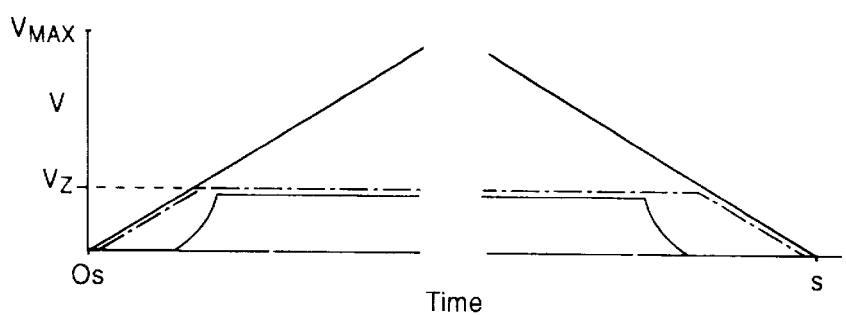
FIG. 4 is a graph of the voltage input vs. the voltage levels at various times of the circuit during regulation.

The zener diode Z1 in the preferred embodiment is a five-volt device at a specified current IZT, in that the voltage across the zener diode equals five volts at the zener test current IZT passing through the diode. Currents above the specified IZT will result in the voltage across the zener diode Z1 to rise in the same manner that currents below the specified IZT will result in the voltage across the zener diode to fall. It is a characteristic of low-test current zener diodes that the diode has high zener impedance, therefore, minimizing the change in the zener current will provide a more stable five-volt reference $V_{Z1}$ shown in FIG. 4. This is insured by the constant current configuration of this five-volt regulated voltage supply 10.

As an example the values of the regulated voltage supply 10 circuit of FIG. 2 are:

R1 10K
R2 10K
R3 10K
Load MCU NEC UPD780973A
R5 10K
R6 47K
Z1 1N4689
Q1 MPSA06
Q2 MPSA06
Q3 MPSA56
Q4 MPSA56
V1 6<V1<18

These values will be used as an example to explain the operation of the preferred embodiment of the invention only and are not values of limitation.

When the battery supply voltage V1 rises above 6 volts, the input voltage required to allow regulation, current will conduct through the resistor R3, the zener diode Z1 and the resistor R1. Assuming the transistor Q1 has nominal base-emitter voltage, Q1VBE, of 0.6 volts and the IZT of the zener diode Z1 is fifty microamps (50 uA); current will not begin to flow through the base-emitter circuit of Q1 until 60 uA flows through the resistor R1 to ground. This will bring Q1 into conduction as the voltage of 0.6 volts, Q1VBE, is at the base of the transistor Q1. Once Q1VBE is 0.6 volts, then base current will flow through the base-emitter junction of the transistor Q1 bringing the transistor Q1 into conduction. Once the voltage at the base of the transistor Q1 is 0.6 volts, current flows through the zener diode Z1 and the cathode of the zener diode Z1 becomes 5.6 volts (the 5 volt drop across the zener and the 0.6 voltage drop across the resistor R1).

The cathode of the zener diode Z1 is directly connected to the base of the transistor Q2 that along with the transistor Q3 is connected in a current amplifier 12 configuration. When the base voltage of the transistor Q2 reaches 5.6 volts, the emitter of the transistor Q2 and the collector of the transistor Q3 will form the output of the five volt current amplifier 12 voltage regulator and will have a potential of five volts. As long as the current through the zener diode Z1 is regulated close to the specified IZT, here 50 uA, the output of the five-volt current amplifier 12 will remain stable.

The current amplifier function of the current amplifier voltage regulator operates so that the current draw through the base-emitter of the transistor Q2 is virtually independent of the load current through the emitter-collector circuit of the transistor Q3. This permits the voltage drop across the base-emitter of the transistor Q2 to be independent of the load current and therefore is constant.

Figure 3:
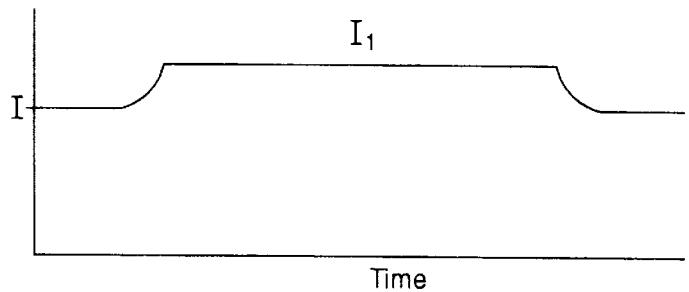
FIG. 3 is current graph for the zener diode.

As the battery supply voltage V1 rises above six volts, any excess current through the resistor R3 will be shunted through the collector-emitter junction of the transistor Q1 to ground. This shunting will keep a constant 60 uA current through the zener diode Z1. In order for this to take place, the transistor Q1 must be a high gain device, i.e. hfe=>200. As the input voltage V1 begins to rise, a small increase in the base current of the transistor Q1 causes the collector-emitter circuit of the transistor Q1 to conduct. This shunts the majority of the current from the resistor R3 through the transistor Q1 resulting in a negligible current rise, 10 ua, through the zener diode Z1. In addition Q1 base emitter current varies a negligible amount with swings in V1. As illustrated in the current waveshapes of FIG. 3 and the voltage waveshapes of FIG. 4, this negligible current rise through the zener diode Z1 permits essentially a constant current to be maintained through the zener diode as the input voltage V1 ranges from six volts to eighteen volts.

Yet another feature of the regulated voltage supply circuit 10 described herein as opposed to that described in U.S. Pat. No. 5,760,625, is its improved stability of the five-volt output load current variation. This improved five volt output voltage tolerance versus the five volt output load current variation is achieved by having all the circuit elements that establish the five volt output voltage be immune to changes in the five volt output current. The five-volt output voltage can be defined as:

5 v output voltage=Z1 voltage–Q1$vbe$–Q2$vbe$ The voltage drop across Z1 and Q1$vbe$ are independent of load current changes due to the constant current configuration already described. Q2$vbe$ is nearly constant due to the current amplifier configuration of Q2 and Q3. Q2$vbe$ is a function of Q2$ib$ that can be approximated as:

Q2$ib$=5 v output current/(hfeQ2*hfeQ3)

Since the gain (hfe) of Q2 and Q3 is high, around 100, the Q2$ib$ will vary from 0.1 ua to 10 ua as the five-volt output current varies from 1 ma to 100 ma. This Q2$ib$ variation will result in a Q2$vbe$ variation of about 100 mv, which will translate into a five-volt output voltage variation of 0.1 v or 2% of the output voltage. If the current amplifier was removed by deleting Q3 and tying the collector of Q2 to battery supply voltage V1, the variation in 5 v output voltage as a function of 5 v output current over the same range would be 150 mv or 3% of the output voltage.

A low voltage inhibit function is critical for a microprocessor MCU 20 based application in motor vehicles. During engine crank and other extreme loading conditions, the battery supply voltage V1 can drop to as low as three volts. This low input voltage will result in the five volt output voltage to drop below 5 v and in this case the MCU must be placed in the reset state until the battery supply voltage V1 rises high enough to permit the five volt output to be established. Reset is typically accomplished by placing a logic low signal on the microprocessor's reset input 24.

The low voltage inhibit circuit 16 operates as follows. Referring to FIG. 2, the reset circuit is formed by the resistor R2, the transistor Q4, the resistor R5 and the resistor R6. The base of the transistor Q4 is directly connected to the cathode of the zener diode Z1, its emitter is connected to the battery supply or input voltage V1 through a resistor R2 and the collector is connected through resistors R5 and R6 to ground. The reset input 24 of the MCU 20 is connected to the node 26 formed by the connection of the resistors R5 and R6. When the five-volt regulated voltage supply 10 is regulating, the cathode of the zener diode Zi is 5.6 volts. This occurs when the input voltage V1 is greater than 6 volts.

When the regulated voltage supply 10 circuit for the five volts supply is operating, the MCU 20 may be allowed to be out of reset by placing a logic one value, typically greater than 4 volts, at its reset input 24. This occurs when the cathode of the zener diode Z1 is 5.6 volts; the base of the transistor Q4 will also be 5.6 volts. Once the input voltage V1 rises above 6.2 volts, the base-emitter circuit of the transistor Q4 will become conducting turning on the transistor Q4. As explained by transistor physics, since the base voltage of transistor Q4 is held to 5.6 volts, its emitter voltage will be a diode drop above the base or about 0.6 volts to 6.2 volts. With the transistor Q4 turned on, the collector voltage will be equal to the voltage on the emitter minus the negligible Q4VEC. The series combination of the two resistors R5 and R6, having a ratio of 1:5 provides a voltage divider creating the voltage at the reset input 24 of the MCU 20 to be approximately 5 volts. This is a voltage greater than the required reset logic one voltage, allowing the MCU 20 to be out of reset.

The operation of the low voltage inhibit circuit 16 begins when the input voltage V1 begins to fall below the voltage required for regulation of the regulated voltage supply 10. When the input voltage V1 falls, the voltage at the base and the emitter of the transistor Q4 are essentially equal since the zener diode Z1 is not conducting or regulating. Thus, the base and emitter of the transistor Q4 are no longer forwarded biased and the transistor is cut-off. With the transistor Q4 cut off, the reset input 24 of the MCU 20 is held to logic zero state by virtue the resistor R6 being connected to ground.

The low voltage inhibit circuit 16 uses the transistor Q4 to compare the input voltage V1 with the regulation state of the zener diode Z1 as found at its cathode to dictate a reset function. This is in contrast to the previously mention U.S. Pat. No. 5,760,625 wherein the reset voltage was formed by monitoring the current flowing through a voltage reference.

This concludes a description of an embodiment of the invention. The reading of it by those skilled in the art will bring to mind many alterations and modifications beyond those already suggested above with departing from the spirit and scope of the invention. The various values stated herein are for the purposes of explanation only and are not limitations of the invention. The scope of the invention is to be only limited by to the following claims.

What is claimed is:

1. A regulated voltage supply with low voltage inhibit reset circuit for maintaining a regulated voltage to a load independently of the voltage input from the power supply and the output current to the load, the regulated voltage supply comprises:

an input for receiving a voltage signal from the power supply;

an output operatively connected to the load;

a current amplifier connected between said input and said output for supplying current to the load;

a zener diode having an anode and a cathode and electrically connected between said input and a reference potential, said zener diode having a zener voltage substantially equal to the output of the voltage regulator; and a constant current generator electrically connected to said zener diode and operable for maintaining a desired current through said zener diode and to shunt current in excess of said desired current from said zener diode; said constant current generator operable to control said current amplifier for maintaining its output at substantially the value of the zener voltage regardless of the current demand of the load and the voltage variations from the power supply.

2. A regulated voltage supply according to claim 1 wherein said power supply is an automotive battery.

3. A regulated voltage supply according to claim 1 wherein said constant current generator comprises:

a first resistor connected between said input and said cathode of said zener diode;

a second resistor connected between said anode of said zener diode and said reference potential;

a transistor having one of its collector or emitter electrodes connected to said cathode of said zener diode, its control electrode connected to said anode of said zener diode and its other collector or emitter electrodes connected to said reference potential.

4. A regulated voltage supply according to claim 1 wherein said load is a microcomputer and additionally including a low voltage inhibit circuit having a switching transistor having one of its collector or emitter electrodes electrically connected to said input and its base electrically connected to said cathode of said zener diode and operable to reset said microcomputer under low voltage conditions from said input and said zener diode.

5. A regulated voltage supply according to claim 4 wherein said reset voltage is switched from a first level to a second level when said input voltage is greater than said zener voltage for allowing said microcomputer to operate; and switched from said second level to said first level when said input voltage is less than said zener voltage for resetting said microcomputer.

* * * * *